United States Patent [19]

Eouzan et al.

[11] Patent Number: 4,845,382
[45] Date of Patent: Jul. 4, 1989

[54] SAMPLING AND HOLDING CIRCUIT FOR SIGNAL HAVING LOW SAMPLING RESIDUAL COMPONENT, ESPECIALLY FOR THE DUAL SAMPLING OF A CORRELATED SIGNAL GIVEN BY A CHARGE-TRANSFER DEVICE

[75] Inventors: Jean Y. Eouzan, Thorigne; Jean C. Heurtaux, Liffre, both of France

[73] Assignee: Thomson-CSF, Paris, France

[21] Appl. No.: 251,923

[22] Filed: Oct. 3, 1988

Related U.S. Application Data

[63] Continuation of Ser. No. 39,740, Apr. 20, 1987, abandoned.

[30] Foreign Application Priority Data

Apr. 22, 1986 [FR] France .................... 86 05804

[51] Int. Cl.$^4$ .................... H03K 5/00; G11C 27/02
[52] U.S. Cl. .................... 307/353; 307/358; 358/213.16
[58] Field of Search .......... 307/352, 353, 358, 572; 328/151; 358/213.15, 213.16

[56] References Cited

U.S. PATENT DOCUMENTS

| | | |
|---|---|---|
| 3,851,260 | 11/1974 | Colin .................... 307/353 |
| 3,965,368 | 10/1974 | Emmons . | 
| 4,283,742 | 9/1979 | Izumita et al. . |
| 4,287,441 | 9/1981 | Smith .................... 307/353 |

FOREIGN PATENT DOCUMENTS

| | | |
|---|---|---|
| 2704483 | 8/1978 | Fed. Rep. of Germany ...... 307/353 |
| 2361773 | 8/1977 | France . |
| 0072490 | 4/1985 | Japan .................... 307/353 |
| 0186186 | 9/1985 | Japan .................... 307/353 |

OTHER PUBLICATIONS

Electronic Engineering, vol. 48, No. 577, mars 1976, pp. 47-49, Londres, GB; R. C. Tozer: "Sample and Hold Gates Using Field Effect Transistors", p. 49, lignes 18-46; Figure 1.

Funkschau, No. 4, Fevrier 1982, pp. 70-72, Munich, DE; W. Strössenreuther: "Nf-Ströspannung wirksam unterdruckt", En entier.

*Primary Examiner*—John Zazworsky
*Attorney, Agent, or Firm*—Oblon, Spivak, McClelland, Maier & Neustadt

[57] ABSTRACT

The circuit comprises a first sampling/holding circuit, to the input of which is applied the signal to be sampled, a second sampling/holding circuit identical to the first sampling circuit, to the input of which is applied a level of direct electrical voltage, and a differential amplifier coupled by a first input to the output of the first sampling/holding circuit and by a second input to the output of the second sampling/holding circuit. The first and second sampling/holding circuits are controlled with the same control pulses so that the sampled signal given at the output of the differential amplifier is a pure signal rid of the interference sampling signals given by the first sampling/holding circuit.

1 Claim, 3 Drawing Sheets

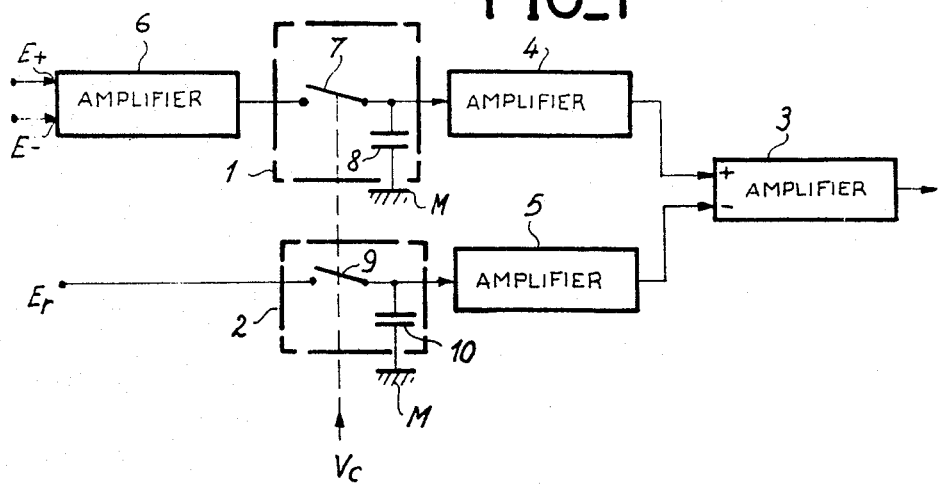
FIG_1
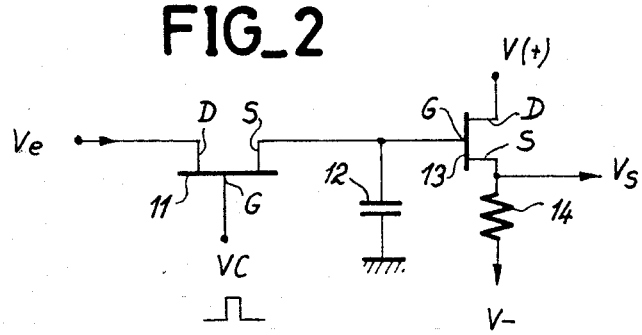
FIG_2
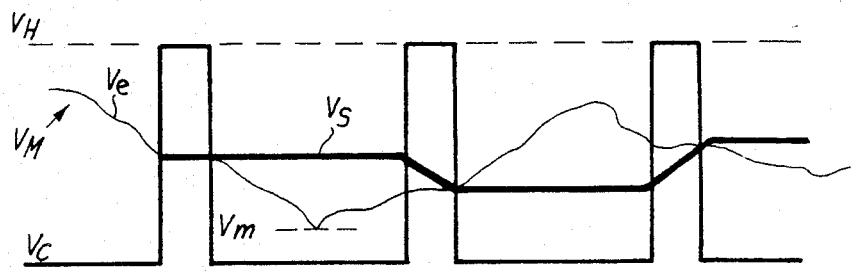
FIG_3

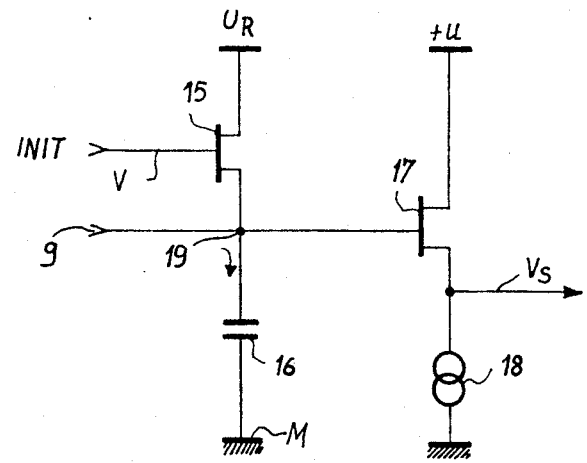
FIG_4
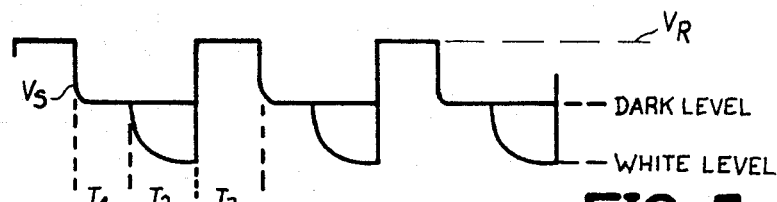
FIG_5
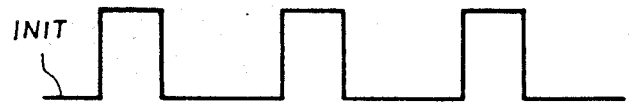
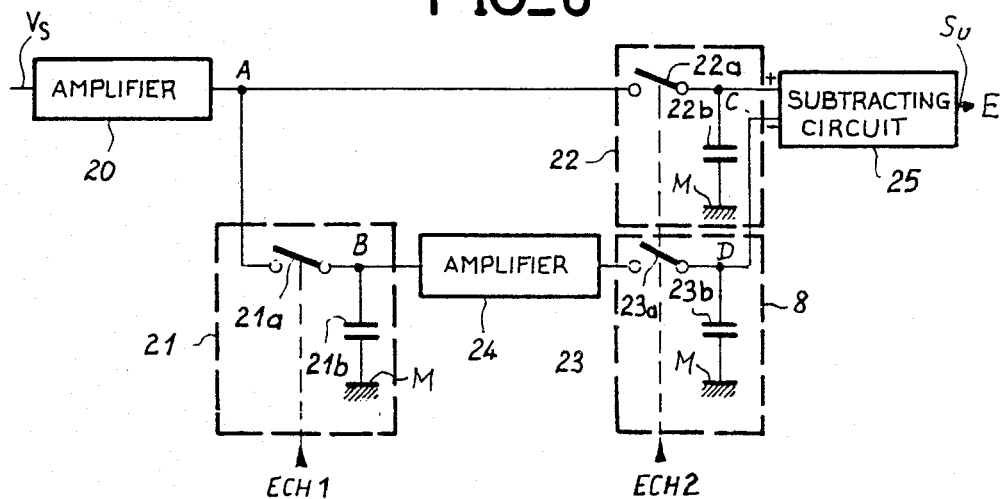
FIG_6

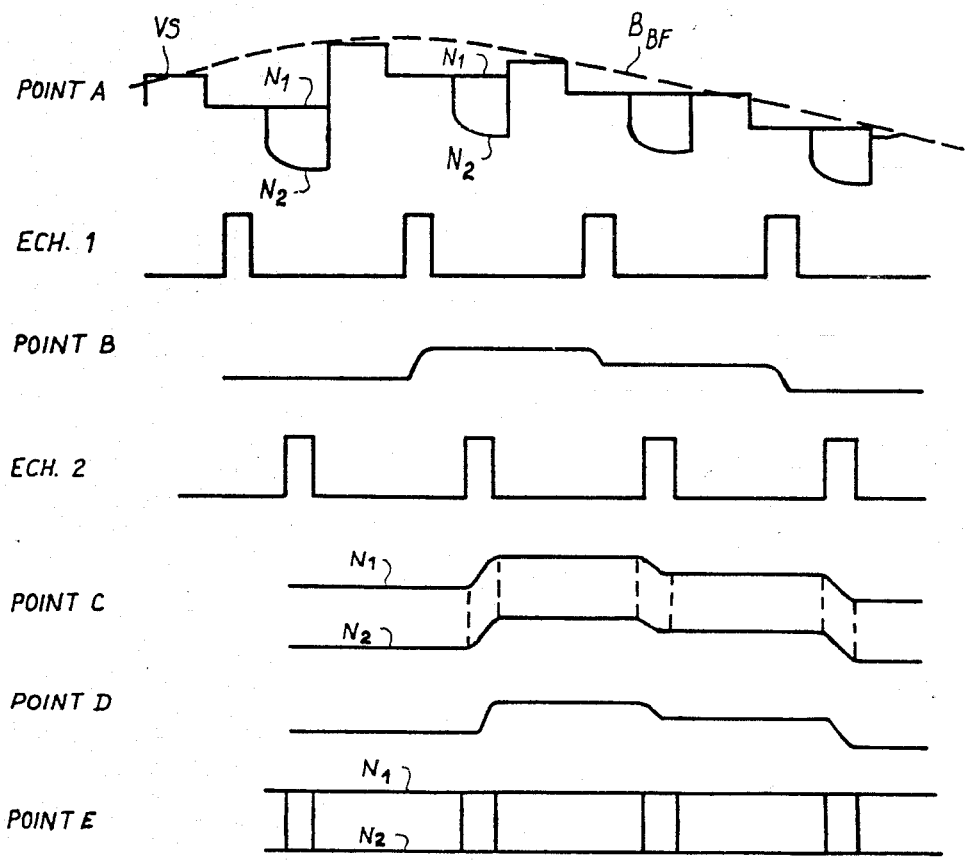
FIG_7

SAMPLING AND HOLDING CIRCUIT FOR SIGNAL HAVING LOW SAMPLING RESIDUAL COMPONENT, ESPECIALLY FOR THE DUAL SAMPLING OF A CORRELATED SIGNAL GIVEN BY A CHARGE-TRANSFER DEVICE

This application is a continuation of application Ser. No. 039,740, filed on Apr. 20, 1987, now abandoned.

BACKGROUND OF THE INVENTION

1. Field of the Invention

The present invention pertains to a sampling and holding circuit signal having low sampling residual component, especially for the dual sampling of correlated signals given by charge-transfer devices, these signals being video signals among others.

2. Description of the Prior Art

Sampling and holding circuits are made in the prior art by means of a cell that memorizes samples of signals given by a current switch and a capacitor. In these devices of the prior art, the current switch often comprises a field effect transistor connected by a source or drain electrode to the capacitor, the other electrode (either drain or source respectively) receiving the signal to be sampled. The "on" or "off" state of the current switch thus formed is controlled by sampling pulses applied to the gate electrode of the field effect transistor. At each sampling pulse, a current flows in the field effect transistor which charges the capacitor throughout the time when the control pulse is applied.

However, the inter-electrode capacitances of field effect transistors are the cause of residual, interference voltages at the frequency of the control signals which are superimposed on the sampled signal at the output of the sampling circuit.

SUMMARY OF THE INVENTION

The aim of the invention is to remove the above disadvantages.

To this end, the object of the invention is a sampling and holding circuit for signal having low sampling residual component comprising a first sampling/holding circuit and a second sampling/holding circuit identical to the first sampling circuit, both these circuits being respectively coupled by their output to a first and a second input of a substracting circuit, wherein the signal to be sampled is applied, on the one hand, directly to the input of the first sampling/holding circuit and, on the other hand, to the input of the second sampling/holding circuit through a third sampling/holding circuit, and wherein the first and second sampling/holding circuits are controlled simultaneously to obtain at the output of the substracting circuit a signal rid of the sampling component provided by the first sampling/holding circuit.

The main advantage of the signal sampling and holding circuit of the invention is that it can be used to sample a very wide range of signals, exhibits short acquisition and establishing times with a very long data-retention time owing to very low leakage currents from the first and second sampling circuits.

Used in television systems where the video signal is obtained by charge-transfer devices, the circuit of the invention provides for the correct alignment of the dark level at each sampling of the luminance signal.

BRIEF DESCRIPTION OF THE DRAWINGS

Other characteristics and advantages of the invention will emerge in the following description, made with reference to the appended drawings, of which:

FIG. 1 is a diagram of the embodiment of the sampling and holding circuit according to the invention;

FIG. 2 is a diagram of the embodiment of a sampling/holding circuit;

FIG. 3 is a timing diagram depicting the working of a sampling circuit according to FIG. 2;

FIG. 4 is a schematic diagram to illustrate the functioning of a charge/voltage converter stage of a charge-transfer device;

FIG. 5 is a timing diagram to illustrate the working of the device of FIG. 4 when this device is acted upon by the signals controlling the charge-transfer devices.

FIG. 6 depicts a use of the device according to the invention for the processing of the signals given by the charge/voltage converter stages of the type depicted in FIG. 4;

FIG. 7 is a timing diagram illustrating the working of the device depicted in FIG. 6.

DESCRIPTION OF THE PREFERRED EMBODIMENTS

The sampling and holding circuit depicted in FIG. 1 comprises a first sampling/holding circuit 1 and a second sampling/holding circuit 2, respectively shown in rectangles drawn with broken lines, both these circuits being connected to a differential amplifier 3 by means of impedance-matching amplifiers 4 and 5 respectively. The signal to be sampled is applied to the input of the sampling/holding circuit 1 through an operational amplifier 6, and this signal can be applied equally to the inputs E+ or E− of the amplifier 6. The sampling/holding circuit 1 comprises, in a known way, a current switch 7 placed in series between the output of the amplifier 6 and the input of the impedance-matching amplifier 4, and by a capacitor 8 placed between the input of the impedance-matching amplifier 4 and the ground circuit M of the circuit. Similarly, the sampling/holding circuit 2 comprises a current switch 9 and a capacitor 10 placed between the input of the impedance-matching amplifier 5 and the ground circuit of the entire device. The function of the current switch 9 is to apply a direct voltage $E_r$ to the input of the impedance-matching amplifier 5, and to charge the capacitor 10 throughout the time when this voltage is applied. The current switches 7 and 9 are controlled simultaneously by a control signal $V_c$.

One mode of embodiment of the sampling/holding circuits is depicted in FIG. 2. The sampling/holding circuit depicted comprises a field effect transistor 11 which acts as the current switches 7 and 9, a capacitor 12 similar to the capacitors 8 and 10 of FIG. 1, coupled to the gate electrode of a field effect transistor 13, mounted as an impedance-matching device by means of a resistor 14 placed in the circuit of the source electrode of the field effect transistor 13. In FIG. 2, the sampled signal $V_e$ is applied to the drain electrode of the transistor 11 and to the terminals of the capacitor 12 when a positive control pulse $V_c$ is applied to the gate electrode of the transistor 11, in order to do the sampling. Assuming that in the example depicted, the field effect transistor 11 is a highly-doped N-channel type transistor, the potentials at these electrodes are defined as shown in FIG. 3, which depicts, side by side on the same graph, the control voltages $V_c$ of the field effect transistor 11, the voltage to be sampled $V_e$ applied to the drain of the transistor 11 and the voltage $V_s$ obtained at the source electrode of the field effect transistor 13. FIG. 3 shows that the control voltage of the gate electrode of the field effect transistor 11 should have a maximum amplitude $V_H$ which is a few volts more than the maximum voltage $V_M$ of the voltage $V_e$ which can be sampled, and that the low level of this control voltage should be such that the field effect transistor 11 continues to be off, despite the development of the voltage applied to the drain electrode towards a minimum value of $V_m$ The sampling instant is determined throughout the period during which the control signal $V_c$ exhibits its maximum amplitude $V_H$ and, during this instant, the corresponding voltage of the signal to be sampled $V_e$ is applied to the terminals of the capacitor 12, remaining memorized at the terminals of this capacitor until the next control pulse appears. The voltage developed at the terminals of the capacitor 12 is read through the field effect transistor 13, the high input impedance value of which limits the discharging of the capacitor 12. For the device according to the invention to work properly, it is imperative that the two sampling/holding circuits 1 and 2 are made in a strictly identical way so that the differential amplifier 3 can eliminate the interference sampling signals caused by the defects of the current switch 7 because, if this condition is assumed, the same interference signals are necessarily created by the current switch 9. Consequently, the interference signals created by each of the sampling/holding circuits 1 and 2 are subtracted from one another by the differential amplifier 3, and the sampled signal given by the output of the differential amplifier circuit 3 is thus rid of the interference signals transmitted by the inter-electrode interference capacitances of the current switches 11.

The sampling and holding circuit of the invention, which has just been described with the help of FIGS. 1, 2 and 3, can be advantageously applied to the making of dual sampling and holding circuits, which can be used to process correlated signals given by charge-transfer devices and, especially, to process video signals given by the charge-transfer matrices of television cameras. An illustration of this problem is given in FIGS. 4 and 5, of which FIG. 4 depicts a schematic drawing of the charge/voltage converter stage which generally constitutes a charge-transfer device, and FIG. 5 is a timing diagram that illustrates the working of the device of FIG. 4 when this device transmits a signal. The electrical charge/voltage converter stage depicted in FIG. 4 comprises a field effect transistor 15 which is connected in series to a capacitor 16 between a reference potential $+U_R$ and a ground point M. The common point between the source or the drain of the transistor 15 and the capacitor 16 is connected to the control gate of a field effect transistor 17 which is supplied by a current source 18 at its drain or at its source. In the charge-transfer device thus depicted, electrical charges q to be transferred are applied to the common point 19 between the transistor 15 and the capacitor 16. These charges develop a voltage at the terminals of the capacitor 16. Between two injections of charges, the capacitor 16 is re-initialized with a reference voltage $U_R$ by the turning on of the transistor 15 which receives an initializing signal INIT at its gate. The signal developed at the terminals of the capacitor 16 is copied by the transistor 17 which restores a signal $V_s$ to the terminals of the current source 18. The transistor 17 consequently provides for the high-impedance reading of the signal thus developed at the terminals of the capacitor 16.

Referring again to the timing diagram depicted in FIG. 5, the signal $V_s$ is seen to comprise three parts which appear regularly during the time intervals $T_1$, $T_2$ and $T_3$, set beside one another in this order in FIG. 5.

The non-useful part of the signal $V_s$ referring, for example, to the dark level of a video signal, appears during the time interval $T_1$. The useful part of the signal appears during the time interval $T_2$. Finally, that part of the signal which appears during the time interval $T_3$ is caused by the initializing pulse applied to the gate of the transistor 15. During the time interval $T_2$, the amplitude of the signal $V_s$ may vary between a reference level on the one hand, for example the dark level if the signal $V_s$ is a video signal, when no charge is injected into the capacitor 16, and a maximum level, on the other hand, corresponding to a saturation level when the charges injected into the capacitor 16 develop a maximum negative voltage. The part that appears during the time interval $T_3$ should theoretically have the same level as the part that appears during the time interval $T_1$, because it corresonds to the initializing stage. However, it is observed that an interference pulse is added to the signal for the duration of this initializing, this pulse being due to the capacitive coupling that exists between the capacitor 16 and the control electrode of the transistor 15.

This difficulty is overcome by using the circuit according to the invention to make a multiplexing circuit of the type depicted in FIG. 6. The device depicted in FIG. 6 comprises a first amplifier 20, first, second and third sampling/holding circuits bearing the references 21, 2 and 23 respectively, an amplifier 24 and a subtracting circuit 25. The amplifier 20 receives, at its input, the signal $V_s$ of the FIG. 5 given by the charge-transfer device described earlier with reference to FIG. 4, to the output of which it is connected. The output (point A) of the amplifier circuit 20 is connected, on the one hand, to the input of the first sampling/holding circuit 21 and, on the other hand, to the input of the second sampling/holding circuit 22. The output (point B) of the first sampling/holding circuit 21 is connected to the input of the third sampling/holding circuit 23 by the amplifier circuit 24. The outputs of the second (point C) and third (point D) sampling/holding circuits 22 and 23 are respectively connected to the inputs marked "+" and "−" of the subtracting circuit 25. Each of the sampling/holding circuits 21, 22 and 23 is made up, in a known way, of current switches of the field effect transistor or equivalent type, respectively marked 21a, 22a and 23a, and by capacitors respectively marked 21b, 22b and 23b. The capacitor 22b is connected between the input marked "+" of the subtracting circuit 25 and the ground line M. The capacitor 21b is connected between the input of the amplifier circuit 24 and the ground line M. The capacitor 23b is connected between the input marked "−" of the subtractor 25 and the ground line M. The switch circuit 22a connects the output of the amplifier circuit 20 with the input marked "+" of the subtracting circuit 25 on the one hand, and with the corresponding end of the capacitor 22b on the other hand. The switch circuit 21a connects the output of the amplifier circuit 20 with the input of the amplifier circuit 24 on the one hand, and the corresponding end of the capacitor 21b on the other hand. Finally, the current switch 23a connects the output of the amplifier circuit 24 with the input "−" of the subtracting circuit 25 on the one hand, and with the corresponding end of the capacitor 23b on the other hand.

The current switch 21a is controlled by signal ECH 1 and the current switches 22a and 23a are controlled simultaneously by a sampling signal ECH 2, for which the relative positions in time with reference to the input signal $V_s$ are depicted in FIG. 7. The signal $V_s$ depicted in FIG. 7 has the shape of the signal of FIG. 5 with, however, the difference of having an added low-frequency noise component $B_{BF}$, the envelope of which is shown with dashes. The signal shown below the signal $V_s$ is the sampling signal ECH 1 which controls the closing of the current switch 21a at each appearance of the dark level of the signal $V_s$. The sampled signal, representing the dark levels of the signal $V_s$ applied to the input of the amplifier 24, is shown in the following line in the shape of stages representing the successive dark levels of the signal $V_s$. The signal ECH 2, which is shown in the following line and controls the shutting of the current switches 22a and 23a, appears simultaneously at the instants when the useful information of the signal $V_s$ appears, and the samples retained, which are memorized in the capacitor 22b connected to the input marked "+" of the subtracting circuit 25, are depicted in the following line as two juxtaposed signals which correspond, in the depicted example of the signal $V_s$, to two levels, a minimum level $N_1$ and a maximum level $N_2$. $N_1$ corresponds, for example for a video signal, to a dark level and $N_2$ corresponds to the saturation level. The following line represents the signal which is applied to the input marked "−" of the subtractor 25 and which corresponds to the transfer of the signal levels, memorized in the capacitor 21b, to the capacitor 23b at the sampling instants ECH 2. Finally, the last line shows the signals corresponding to the levels $N_1$ and $N_2$ of the signal $V_s$, which is depicted in the first line and which appears at the output of the subtracting circuit 25 (point E).

If $B_{BF}$ designates the low-frequency noise component, PAR1 the interference signal given by the sampling/holding circuit 21, PAR2 the interference signal respectively given by each of the sampling/holding circuits 22 and 23, and $S_u$ the useful signal of the signal $V_s$, the working of the circuit of FIG. 6 can be explained with the help of these references as follows: The signal memorized in the capacitor 21b by the sampling/holding circuit 21 contains the low-frequency noise information $B_{BF}$ to which the interference signal PAR1 is added. The signal memorized in the capacitor 22b by the sampling/holding circuit 22 contains the information of the useful signal $S_u$ to which is added the low-frequency noise $B_{BF}$ and the interference signal given by the sampling/holding circuit 22. The signal memorized in the capacitor 23b of the sampling/holding circuit 23 contains the low-frequency noise $B_{BF}$ to which is added the interference signal PAR2 given by the sampling/holding circuit 23, the interference signal PAR1 having been eliminated by the sampling/holding circuit 23 due to the gate-drain and gate-source capacitance and the drain-source resistance of the field effect transistor of the sampling/holding circuit 23. The subtracting circuit 25, which performs the subtraction between the amplitude of the signal memorized in the capacitor 22b and the amplitude of the signal memorized in the capacitor 23b, thus gives a signal which verifies the following relation:

$$(S_u + B_{BF} + PAR2) - (B_{BF} + PAR2) = S_u$$

The signal given by the output of the subtracting circuit 25 thus appears rid of the noise components and interferences transmitted by the various sampling/holding circuits, and should the processed signal be a video signal, the dark level for each sampling of the luminance signal would thus be properly aligned.

What is claimed is:

1. Sampling and holding circuit, for the dual sampling of a correlated video signal of the type having three juxtaposed time intervals for transmitting a dark level, luminance signal and initializing pulse, said video signal being supplied by a charge voltage converter stage of a charge-transfer device, comprising a first sampling/holding circuit, a second sampling/holding circuit identical to the first sampling circuit, and third sampling/holding circuit, both said first and second sampling/holding circuits being respectively coupled by their outputs to a first and a second input of a subtracting circuit, wherein said video signals given by the charge-transfer device are applied, on the one hand, directly to the input of the first and third sampling/holding circuits and, on the other hand, to the input of the second sampling/holding circuit through said third sampling/holding circuit, and wherein the first and second sampling/holding circuits are controlled simultaneously during those periods when the luminance signal of the video signal appears, the third sampling/holding circuit being controlled during dark periods of said video signal, for aligning the dark level for each sampling of luminance properly.

* * * * *